United States Patent
Fogel et al.

(10) Patent No.: US 9,754,875 B1
(45) Date of Patent: Sep. 5, 2017

(54) DESIGNABLE CHANNEL FINFET FUSE

(71) Applicant: International Business Machines Corporation, Armonk, NY (US)

(72) Inventors: Keith E. Fogel, Hopewell Junction, NY (US); Pouya Hashemi, White Plains, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/214,647

(22) Filed: Jul. 20, 2016

(51) Int. Cl.
| | |
|---|---|
| *H01L 23/52* | (2006.01) |
| *H01L 23/525* | (2006.01) |
| *H01L 27/12* | (2006.01) |
| *H01L 21/84* | (2006.01) |
| *H01L 29/66* | (2006.01) |
| *H01L 21/56* | (2006.01) |

(Continued)

(52) U.S. Cl.
CPC .... *H01L 23/5256* (2013.01); *H01L 21/02694* (2013.01); *H01L 21/26513* (2013.01); *H01L 21/56* (2013.01); *H01L 21/845* (2013.01); *H01L 27/1211* (2013.01); *H01L 29/16* (2013.01); *H01L 29/66545* (2013.01)

(58) Field of Classification Search
CPC ........... H01L 23/5256; H01L 21/02694; H01L 21/26513; H01L 21/56; H01L 21/845; H01L 27/1211; H01L 29/16; H01L 29/66545; H01L 27/10826; H01L 27/10879; H01L 29/41791; H01L 29/66795; H01L 2029/7858; H01L 2924/13067; H01L 21/823431; H01L 21/823821; H01L 27/0886; H01L 27/0924; H01L 29/785; H01L 29/66818; H01L 29/7856; H01L 23/62; H01L 27/1026; H01L 27/11206; H01L 23/525

See application file for complete search history.

(56) References Cited

U.S. PATENT DOCUMENTS

| | | | |
|---|---|---|---|
| 7,531,886 B2 | 5/2009 | Chakravarti et al. | |
| 7,777,297 B2 * | 8/2010 | Yang | H01L 23/5256 257/209 |

(Continued)

FOREIGN PATENT DOCUMENTS

CN 101800083 A 8/2010

OTHER PUBLICATIONS

Adusumilli, Praneet et al., "Epitaxial Semiconductor Fuse for FinFET Structure," U.S. Appl. No. 14/930,107, filed Nov. 2, 2015, pp. 1-21.

*Primary Examiner* — Scott B Geyer
(74) *Attorney, Agent, or Firm* — Daniel P. Morris, Esq.; Otterstedt, Ellenbogen & Kammer, LLP

(57) ABSTRACT

On-chip, doped semiconductor fuse regions compatible with FinFET CMOS fabrication are formed from the channel regions of selected fins. One or more fin dimensions are optionally reduced in selected channel regions of the fins following dummy gate removal, such as height and/or width. The channel regions from which the fuse regions are formed are doped to provide electrical conductivity, amorphized using ion implantation, and then annealed to form substantially polycrystalline fuse regions. Source/drain regions function as terminals for the fuse regions.

11 Claims, 5 Drawing Sheets

(51) Int. Cl.
*H01L 29/16* (2006.01)
*H01L 21/265* (2006.01)
*H01L 21/02* (2006.01)

(56) References Cited

U.S. PATENT DOCUMENTS

| | | | |
|---|---|---|---|
| 8,030,736 B2 | 10/2011 | Booth, Jr. et al. | |
| 8,400,813 B2 | 3/2013 | Lee | |
| 8,471,296 B2 | 6/2013 | Cheng et al. | |
| 8,630,108 B2 | 1/2014 | Li | |
| 8,957,482 B2 | 2/2015 | Hsueh et al. | |
| 8,969,999 B2 | 3/2015 | Liang et al. | |
| 9,041,151 B2 * | 5/2015 | Lavoie | H01L 28/00 257/529 |
| 9,613,899 B1 * | 4/2017 | Adusumilli | H01L 23/5256 |
| 2007/0029576 A1 * | 2/2007 | Nowak | H01L 27/10 257/209 |
| 2008/0157201 A1 * | 7/2008 | Marshall | H01L 23/5256 257/350 |
| 2008/0286905 A1 * | 11/2008 | Breitwisch | H01L 23/5252 438/131 |
| 2013/0009254 A1 * | 1/2013 | Russ | H01L 23/5256 257/379 |
| 2013/0106496 A1 * | 5/2013 | Chang | H01L 23/5256 327/525 |
| 2014/0342537 A1 * | 11/2014 | Wu | H01L 29/66795 438/513 |
| 2016/0056162 A1 * | 2/2016 | Yeh | H01L 29/78 257/379 |

\* cited by examiner

DESIGNABLE CHANNEL FINFET FUSE

BACKGROUND

The present disclosure relates generally to the electrical, electronic and computer arts and, more particularly, to FinFET structures and their fabrication.

Fin-type field-effect transistors (FinFETs) have three-dimensional, non-planar configurations including fin-like structures extending above substrates. The substrates may include semiconductor on insulator (SOI) substrates or bulk semiconductor substrates. Silicon fins are formed in some FinFETs on substrates via known technology such as sidewall image transfer (SIT). FinFET structures including SOI substrates can be formed, in part, by selectively etching the crystalline silicon layers down to the oxide or other insulating layers thereof following photolithography. Active fin heights are set by SOI thickness when employing SOI substrates. In bulk FinFETs, active fin height is set by oxide thickness and etched fin height. The gates of FinFETs can be formed using a "gate-first" process wherein a gate stack and spacers are formed prior to selective epitaxial growth wherein source and drain regions are enlarged. A "gate-last" process may alternatively be employed wherein the source/drain regions are formed following fin patterning. Gate-last procedures can involve making a dummy gate, fabricating other elements of the transistor such as the source/drain regions, removing the dummy gate, and replacing the removed dummy gate with actual gate materials.

In some replacement gate processes, disposable gate level layers are deposited on a semiconductor substrate as blanket layers, i.e., as unpatterned contiguous layers. The disposable gate level layers can include, for example, a vertical stack of a disposable gate dielectric layer, a disposable gate material layer, and a disposable gate cap dielectric layer. The disposable gate dielectric layer can be, for example, a layer of silicon oxide, silicon nitride, or silicon oxynitride. The thickness of the disposable gate dielectric layer can be from 1 nm to 10 nm, although lesser and greater thicknesses can also be employed. The disposable gate material layer includes a material that can be subsequently removed selective to the dielectric material of a planarization dielectric layer to be subsequently formed. For example, the disposable gate material layer can include a semiconductor material such as a polycrystalline semiconductor material or an amorphous semiconductor material. The thickness of the disposable gate material layer can be from 30 nm to 300 nm, although lesser and greater thicknesses can also be employed. The disposable gate cap dielectric layer can include a dielectric material such as silicon oxide, silicon nitride, or silicon oxynitride. The thickness of the disposable gate cap dielectric layer can be from 3 nm to 30 nm, although lesser and greater thicknesses can also be employed. Any other disposable gate level layers can also be employed provided that the material(s) in the disposable gate level layers can be removed selective to a planarization dielectric layer to be subsequently formed.

The disposable gate level layers are lithographically patterned to form disposable gate structures. Specifically, a photoresist is applied over the topmost surface of the disposable gate level layers and is lithographically patterned by lithographic exposure and development. The pattern in the photoresist is transferred into the disposable gate level layers by an etch process, which can be an anisotropic etch such as a reactive ion etch (RIE). The remaining portions of the disposable gate level layers after the pattern transfer form the disposable gate structures.

Disposable gate stacks may include, for example, first disposable gate structures formed over a first body region in a first device region (for example, an nFET region) and second disposable gate structures formed over a second body region in a second device region (for example, a pFET region). The first disposable gate structures can be a stack of a first disposable gate dielectric and gate material portions and first disposable gate cap portions, and the second disposable gate structures can be a stack of a second disposable gate dielectric and second disposable gate material portions and a second disposable gate cap portion. The first and second disposable gate cap portions are remaining portions of the disposable gate cap dielectric layer, the disposable gate material portions are remaining portions of the disposable gate material layer, and the disposable gate dielectric portions are remaining portions of the disposable gate dielectric layer.

Source/drain extension regions are formed after the disposable gate structures have been completed. For example, selected dopants can be implanted into portions of the first body region that are not covered by the first disposable gate structures to form source/drain extension regions. Similarly, other selected dopants can be implanted into portions of the second body region that are not covered by the second disposable gate structures. Gate spacers can be formed on sidewalls of each of the disposable gate structures, for example, by deposition of a conformal dielectric material layer and an anisotropic etch. Ion implantations can be employed to form source regions and drain regions for some devices. For example, dopants can be implanted into portions of the body regions that are not covered by the disposable gate structures and spacers.

A planarization dielectric layer is deposited over the semiconductor substrate, the disposable gate structures, and the gate spacers. The planarization dielectric layer may include a dielectric material that can be planarized, for example, by chemical mechanical planarization (CMP). For example, the planarization dielectric layer can include a doped silicate glass, an undoped silicate glass (silicon oxide), and/or porous or non-porous organosilicate glass. The planarization dielectric layer is planarized above the topmost surfaces of the disposable gate structures.

The disposable gate structures are removed by at least one etch. The at least one etch can be a recess etch, which can be an isotropic etch or anisotropic etch. The removal of the disposable gate structures can be performed employing an etch chemistry that is selective to the gate spacers and to the dielectric materials of the planarization dielectric layer. Cavities are formed from the spaces remaining after the disposable gate structures are removed. The semiconductor surfaces above the channel regions of the substrate can be physically exposed at the bottoms of the gate cavities, though native oxide layers may be present. The gate cavities are laterally enclosed by the gate spacers that were formed on the sidewalls of the disposable structures.

Replacement gate structures are ordinarily formed in the gate cavities. Replacement gate structures are formed by replacement of the disposable structures and overly channel regions of field effect transistors having permanent gate structures. A gate dielectric and a gate electrode are formed within each of the gate cavities. A gate dielectric layer can be deposited on the bottom surface and sidewall surfaces of each gate cavity and over the planarization dielectric layer. The gate dielectric layer can be deposited as a contiguous gate dielectric layer that contiguously covers all top surfaces of the planarization dielectric layer and all inner sidewall surfaces of the gate spacers. The gate dielectric layer can be a high dielectric constant (high-k) material layer having a dielectric constant greater than 3.9. Gate dielectric layers can include a dielectric metal oxide, which is a high-k material containing a metal and oxygen. Dielectric metal oxides can be deposited by methods well known in the art including, for example, chemical vapor deposition (CVD), physical vapor deposition (PVD), molecular beam deposition (MBD), pulsed laser deposition (PLD), liquid source misted chemical deposition (LSMCD), and atomic layer deposition.

Fuses are employed within integrated circuit devices for a number of purposes, such as to program certain functionality into the device or to enable or disable various devices.

BRIEF SUMMARY

Techniques are provided for forming fuses during FinFET CMOS fabrication.

In one aspect, an exemplary fabrication method includes obtaining a monolithic structure including a semiconductor fin, a dummy gate on the semiconductor fin, spacers on the dummy gate, and first and second source/drain regions on opposing sides of the dummy gate. The dummy gate is removed to expose a portion of the fin beneath the dummy gate. The method further includes doping the exposed portion of the fin with an n-type or a p-type dopant, amorphisizing the exposed portion of the fin, and annealing the amorphized, exposed portion of the fin to obtain a doped, substantially polycrystalline fuse region operatively associated with the source/drain regions.

In another aspect, an exemplary monolithic structure includes a substrate including a plurality of parallel, monocrystalline semiconductor fins, the fins including one or more channel regions and outer fin portions integral with and adjoining the channel regions. Source/drain regions are on the outer fin portions of one or more of the fins and each of the channel regions is adjoined by a pair of the source/drain regions. A gate structure adjoins each channel region. The channel region of at least one of the parallel semiconductor fins includes a substantially polycrystalline, doped fuse region operatively associated with a pair of the source/drain regions.

Techniques as disclosed herein can provide substantial beneficial technical effects. By way of example only and without limitation, one or more embodiments may provide one or more of the following advantages:
   Fabrication of on-chip fuse during FinFET CMOS fabrication;
   Improvement of system integration;
   Simplification of fabrication process;
These and other features and advantages will become apparent from the following detailed description of illustrative embodiments thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present disclosure will be described herein in the context of illustrative embodiments. It is to be appreciated, however, that the specific embodiments and/or methods illustratively shown and described herein are to be considered exemplary as opposed to limiting. Moreover, it will become apparent to those skilled in the art given the teachings herein that numerous modifications can be made to the embodiments shown that are within the scope of the claims. That is, no limitations with respect to the embodiments shown and described herein are intended or should be inferred.

One or more embodiments provide a FinFET structure wherein a semiconductor fuse is formed by a portion of a fin within a gate (channel) region. An exemplary fabrication method for forming polycrystalline fuses in one or more fin channel regions is further described.

Figure 1A:
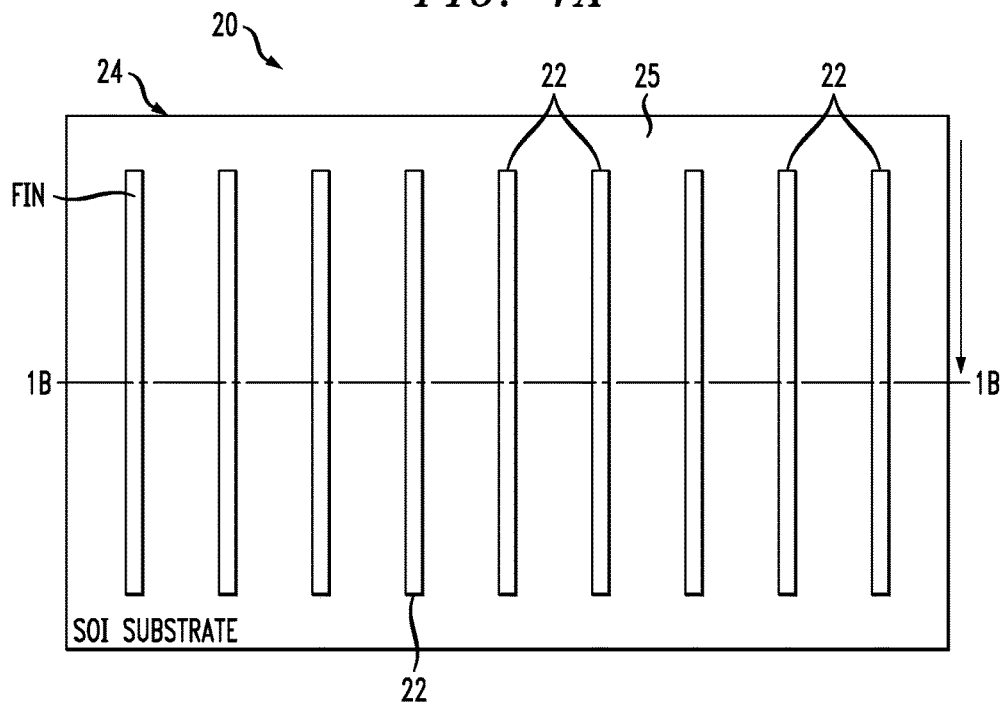
FIG. 1A is a schematic top plan view of an array of fins formed using a semiconductor-on-insulator substrate.
Figure 1B:
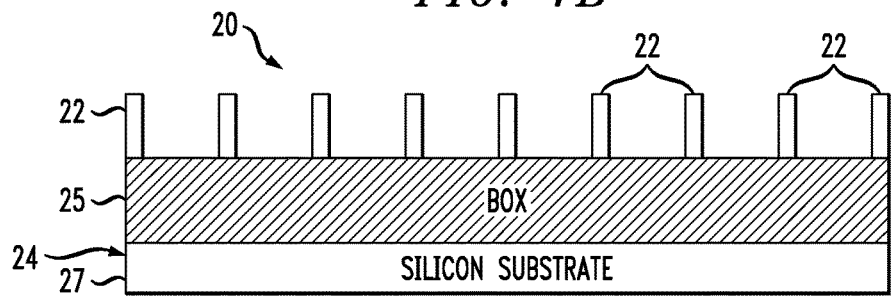
FIG. 1B is a sectional view thereof taken along line 1B.
Figure 1C:
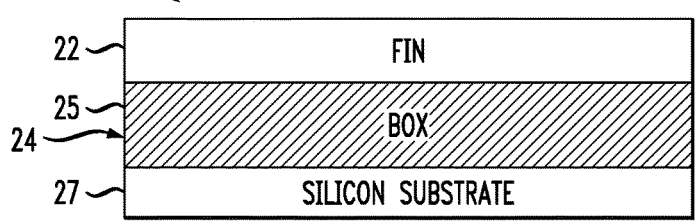
FIG. 1C is a further schematic, cross-sectional view thereof.

FIGS. 1A-1C depict a finned structure 20 formed from a semiconductor-on-insulator substrate 24. The substrate includes a crystalline semiconductor layer, which can be referred to as an SOI layer, from which an array of semiconductor fins 22 is formed. The fin heights are commensurate with the thickness of the SOI layer of the original substrate from which they are formed. Fin pitch is 25-50 nm in some embodiments. The substrate layer is essentially undoped in one or more embodiments. The SOI layer and resulting fins 22 are substantially monocrystalline in some embodiments. The SOI layer from which the fins 22 are formed and the bottom substrate layer 27 may be, but are not necessarily, comprised of the same materials. An electrically insulating layer 25 such as a buried oxide (BOX) layer is provided between the substrate layer 27 and the SOI layer. Silicon dioxide is among the materials that may be employed to form the electrically insulating layer 25. Other buried insulators such as boron nitride (BN) and aluminum oxide ($Al_2O_3$) may alternatively be employed to form the BOX layer in some embodiments. Depending on the heights of the fins 22 to be formed, in some embodiments the thickness of the crystalline semiconductor layer (SOI layer) is in the range of 10 nm to 60 nm. Various methods of fabricating semiconductor-on-insulator (SOI) substrates as employed in one or more embodiments are known, one of which is Separation-by-Implanted Oxygen (SIMOX), wherein oxygen ions are implanted into a single crystal silicon substrate to form a BOX film. Another method of forming an SOI substrate is through the SMART CUT® method and wafer bonding, wherein two semiconductor substrates with silicon oxide surface layers are bonded together at the silicon oxide surfaces to form a BOX layer between the two semiconductor substrates. Methods of forming semiconductor fins 22 using photolithography or sidewall image transfer (SIT) are familiar to those of skill in the art. SIT facilitates the fabrication of fins that are smaller in spacing than photolithographic techniques permit. The SIT process forms features (such as fins) with a pitch equal to half of the smallest pitch obtainable with lithography. For example, with the state-of-the-art UV sources at 193 nm wavelength the smallest pitch that can be formed with conventional lithography is about 80 nm; the SIT process can generate fins with a pitch of about 40 nm. Fins 22 having widths of eight nanometers (8 nm) or less are provided in some embodiments. It will be appreciated that the fins 22 may or may not have sidewalls that are entirely vertical. The bottoms of the fins may in fact be larger in width than the top portions thereof. For example, if a substrate in an exemplary embodiment is a (100) substrate, the side wall surfaces of the semiconductor fins described as (110) surfaces are at least close to being (110) surfaces but may or may not be exactly (110) surfaces. It will further be appreciated that the fabrication methods discussed herein can be applied with respect to structures formed on bulk semiconductor (e.g. silicon) substrates as well as SOI substrates to provide fuses in selected regions.

Figure 2A:
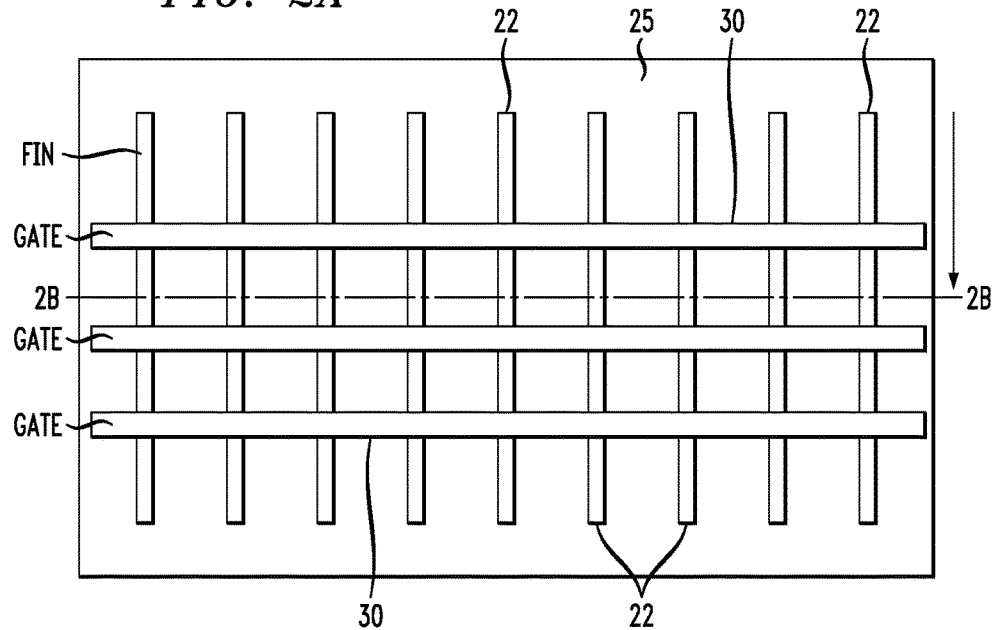
FIG. 2A is a schematic top plan view showing dummy gates formed on the array of fins.
Figure 2B:
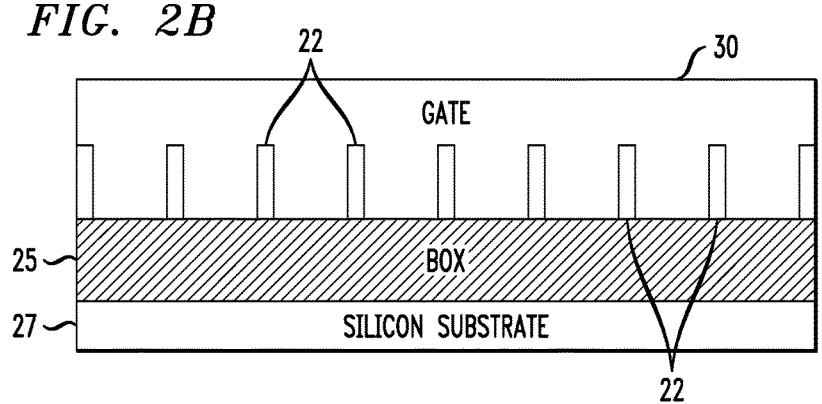
FIG. 2B is a sectional view thereof taken along line 2B.
Figure 2C:
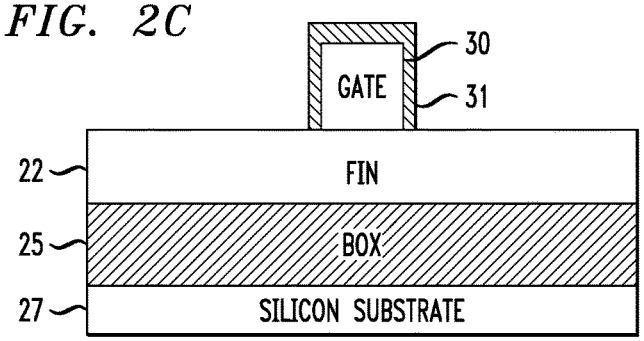
FIG. 2C is a schematic, cross-sectional view showing a dummy gate and gate spacer formed on one of the fins.

With reference now to FIGS. 2A and 2B, dielectric and polysilicon layers may be deposited on the finned substrate and patterned to form dummy gates 30 in accordance with standard polysilicon gate CMOS process flows. The dummy gates 30 extend across a plurality of the parallel semiconductor fins 22 and have substantially the same dimensions in one or more embodiments. Any gate pitch suitable for the intended application of the completed product may be chosen. Gate sidewall structures or spacers 31 are formed on the dummy gates 30, as shown in FIG. 2C. A silicon nitride ($Si_3N_4$) layer can be deposited via CVD, PECVD, sputtering, or other suitable technique, forming the spacers 31. The spacers can include a single layer or be multi-layer. Spacer thickness is between two and ten nanometers (2-10 nm) in some embodiments. Spacers can be formed by any method known in the art, including depositing a conformal nitride layer over the dummy gate structures and removing unwanted material using an anisotropic etching process such as reactive ion etching or plasma etching. The dummy gates 30 and associated spacers 31 protect the underlying portions of the semiconductor fins 22 that later function as channel regions of FinFET devices or, as discussed below, fuse regions within the finned structure. Fin regions outside the dummy gates 30 and spacers 31 are later used to form source/drain regions. Optionally, the fins 22 may be subjected to ion implantation following formation of the gate sidewall spacers 31 to form extension junctions. The spacers 31 may alternatively be formed from other materials, for example siliconborocarbonitride (SiBCN) or siliconoxycarbonitride (SiOCN), siliconoxycarbide (SiOC).

Figure 3:
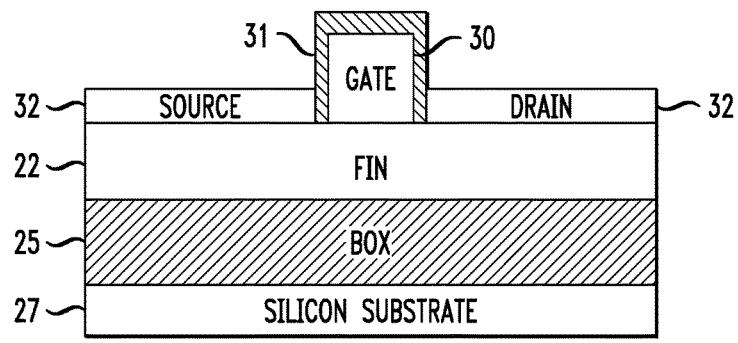
FIG. 3 is a schematic, cross-sectional view showing source/drain regions formed on the finned structure.

Expanded source/drain regions 32 can be grown epitaxially on the exposed portions of the semiconductor fins 22 adjoining the dummy gate and spacers to obtain the structure shown in FIG. 3. Doped silicon or silicon germanium grown epitaxially on the sidewalls (110 surfaces) of silicon fins increases the volumes of the source/drain regions in some embodiments. Either p-type devices or n-type devices can be fabricated depending on the conductivity types of the epitaxial source/drain regions, as known in the art. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of p-type dopants, i.e., impurities include but are not limited to: boron, aluminum, gallium and indium. As used herein, "n-type" refers to the addition of impurities that contributes free electrons to an intrinsic semiconductor. Examples of n-type dopants, i.e., impurities in a silicon-containing substrate include but are not limited to antimony, arsenic and phosphorous. In embodiments where n-type FinFET devices are to be formed, in-situ n-doped silicon may be used to form the epitaxial source/drain regions 32. In-situ doping of the source/drain regions can be conducted using conventional precursor materials and techniques. Source/drain epitaxy to form p-doped source/drain regions may include the introduction of boron precursor gas such as diborane. The p-doped source/drain structures may consist essentially of boron-doped silicon germanium in one or more exemplary embodiments. In one exemplary embodiment where the doped source/drain semiconductor material is silicon germanium (SiGe) containing about thirty-five percent (35%) germanium, the dopant is boron in a concentration in the range of $2-9\times10^{20}$ $cm^{-3}$ and the resulting FinFET structure is p-type. In other embodiments, the source/drain semiconductor material is n-doped silicon and the resulting FinFET structure is n-type. Exemplary epitaxial growth processes that are suitable for use in forming silicon and/or silicon germanium epitaxy include rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition processes typically ranges from 550° C. to 900° C. Fin sidewall surfaces are (110) surfaces in one or more embodiments such that epitaxial growth thereon produces in diamond-shaped structures due to the fact that the growth rate on (111) planes is considerably less than on (110) planes. Self-limiting diamond-shaped structures can accordingly be formed. Growth may be limited in some exemplary embodiments to avoid merging of the faceted source/drain regions. It will be appreciated that doped source/drain regions can be formed using other known methods including but not limited to implantation and diffusion doping techniques.

Figure 4A:
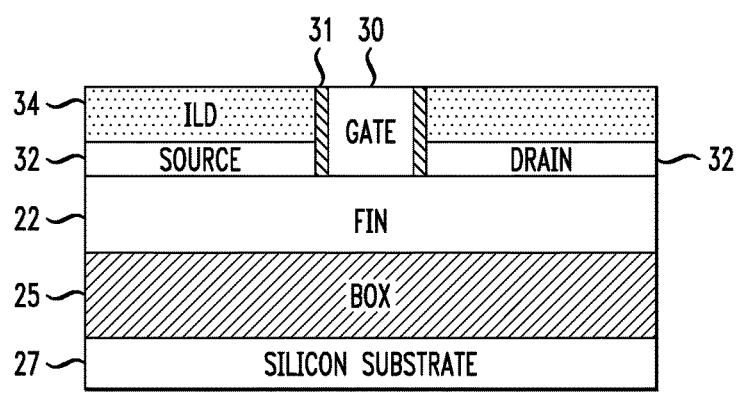
FIG. 4A is a schematic, cross-sectional view showing a interlayer dielectric (ILD) on the structure.
Figure 4B:
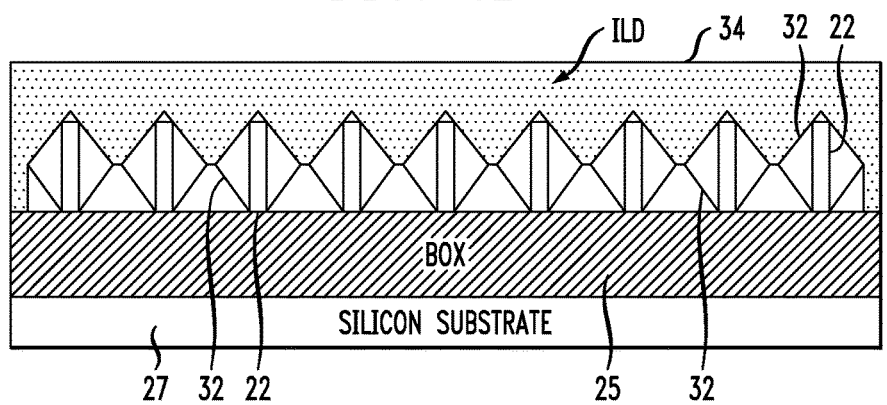
FIG. 4B is a further schematic, cross-sectional view of the structure shown in FIG. 4A.

Once the source/drain regions 32 have been formed and possibly other processing steps are completed, an electrically insulating (ILD) layer 34 as shown in FIGS. 4A and 4B is deposited on the structure and about the dummy gates. The layer 34, for example silicon dioxide, can be formed using CVD or other known techniques. The electrically insulating layer 34 is planarized to expose the polysilicon layer of the dummy gate, as schematically shown in FIG. 4A.

Figure 5:
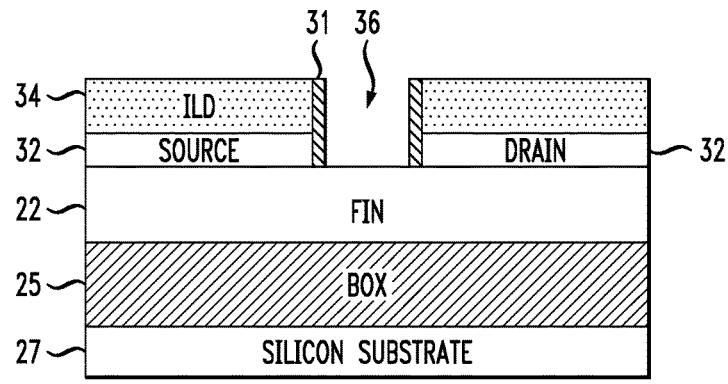
FIG. 5 is a schematic, cross-sectional view showing the structure following removal of the dummy gate.

The dummy gates 30 are removed by a process such as reactive ion etching (ME) and/or wet chemical etching to form recesses 36 bounded by the spacers 31, as shown in FIG. 5. While only one recess 36 is shown in FIG. 5, it will be appreciated that similar recesses may be formed from the removal of the dummy gates 30 in other portions of the structure. In some regions of the resulting structure where the exposed portions of the fins 22 are to be used as channel regions of subsequently formed FinFET devices, the recesses are later filled with a gate dielectric layer, a work function setting material, and metal gate as part of a "gate-last" fabrication process. In accordance with the present disclosure, one or more regions of the resulting structure are employed to form fuses.

Figure 6:
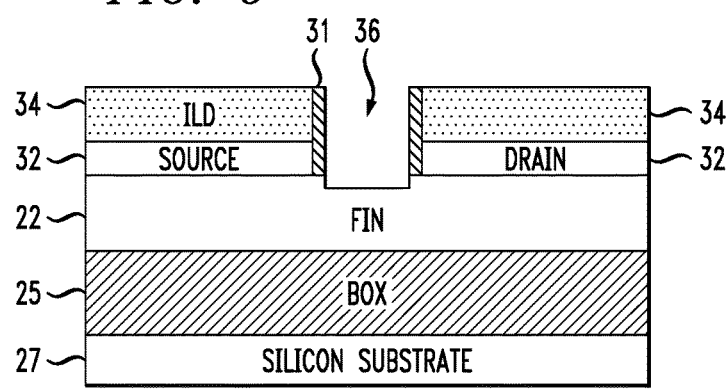
FIG. 6 is a schematic, cross-sectional view showing the structure following recessing of a fin in the gate region.

As shown in FIG. 6, one or more exposed portions of the fins 22 are not employed as channel regions of FinFET devices and are instead partially recessed. Such recessing reduces the heights and widths of the fins 22 in the gate region, thereby facilitating fabrication of a fuse having the desired characteristics when programming the particular electronic device to be fabricated using CMOS technology. In embodiments where the channel regions of one or more fins 22 are recessed during the formation of fuse regions therein, portions of the fins 22 remain in the channel regions thereof. Recessing of selected channel regions of the fins 22 may or may not be uniform. Any suitable process capable of removing fin material without substantially impacting the surrounding structures, including for example the spacers 31, can be used. Exemplary fin trimming processes include wet oxidation, thermal oxidation, hydrochloric acid (HCl) etching and hydrofluoric acid (HF) etching after oxidation. Trimming using HCl gas, for example, removes fin material without affecting the dielectric materials in the structure. If an oxidation process is used, the outer regions of the fin are converted to an oxide while the inner portions remain crystalline. The resulting oxide layer may or may not be removed as the trimmed fin can be implanted (as discussed below) through the oxide layer. Moreover, the space surrounding the trimmed fin is subsequently filled with an oxide layer, so there are no functional or processing issues caused by leaving an oxide layer resulting from an oxidation process on the outer surface of the processed fin region. The possible loss of small amounts of material, for example 6-8 nm, from the ILD layer 34 as a result of the fin trimming process does not materially affect the structure or further processing of the structure. In an exemplary embodiment wherein fin width is eight nanometers (8 nm), one to two nanometers (1-2 nm) are removed or converted to an oxide on each side of the fin channel region to be employed as a fuse. The fin trimming process is timed in some embodiments to obtain a fuse region of desired height and width. The fuse regions formed on a substrate may all have the same height and width. Alternatively, some fuse regions may have fin heights and widths different from other fuse regions formed different parts of a wafer. In some embodiments of the fabrication process, the fin 22 does not require recessing in order to obtain the electrical characteristics necessary for forming a fuse from the channel region thereof and the step is accordingly omitted.

Figure 7:
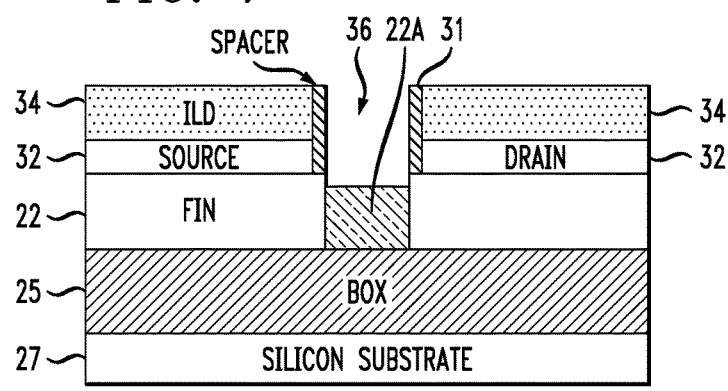
FIG. 7 is a schematic, cross-sectional view showing the structure of FIG. 6 following doping of the exposed fin in the gate region.

Referring to FIG. 7, the exposed fin channel region is subjected to doping to form a doped fin channel region 22A. As discussed above, removal of any oxide layer from the fin surface prior to doping is optional. The doping of the fin channel region imparts a polarity to the region such that the doped channel region will be electrically conductive. It is understood that the doped fin "channel" region is not intended to function as a channel of a transistor device having an operable gate once the fabrication process is completed, but rather as a fuse to be possibly destroyed at a later time. Vapor phase doping (VPD) using diborane as a doping gas is among the techniques that can be employed. Plasma doping (PLAD) and ion implantation (II) are other alternatives for obtaining the electrically conductive, doped fin channel region 22A. Such doping techniques are known in the art with respect to both planar and three-dimensional device structures and continue to be developed. Other possible doping gases include arsine and phosphine. The structure is annealed during gas phase doping at 800-1,000° C. for five to thirty minutes. In one exemplary embodiment, the dopant is boron and the dopant concentration is in the range of $2\text{-}9 \times 10^{20}$ cm$^{-3}$. As schematically illustrated in the figure, the entirety of the exposed fin channel region is doped following this step of the fabrication process.

Figure 8:
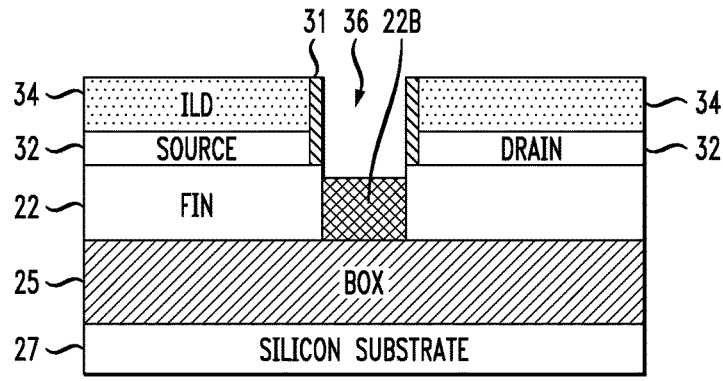
FIG. 8 is a schematic, cross-sectional view showing the structure of FIG. 7 following amorphizing of the exposed fin in the gate region.
Figure 9A:
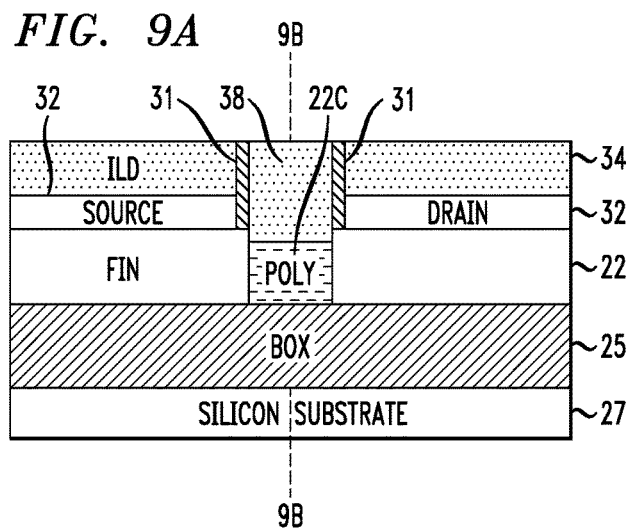
FIG. 9A is a schematic, cross-sectional view showing the structure of FIG. 8A following filling of the gate region within the spacers and annealing.
Figure 9B:
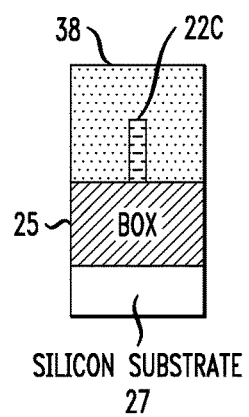
FIG. 9B is a sectional view taken along line 9B-9B of FIG. 9A.

As shown in FIG. 8, the electrically conductive fin channel region 22A is subjected to ion implantation to form an amorphized fin region 22B. It will be appreciated that, if ion implantation is used rather than gas phase doping in the previous step, the exposed fin might be already (partly) amorphized, depending on the implant atom size. Germanium ions, or possibly other non-electrically-active amorphization species such as silicon or argon ions, are implanted to form the amorphized fin region 22B in some embodiments. Amorphization implantation is a well-known method to those of skill in the art; the implant energy and dose depends on fin height (as trimmed), fin width, fin material, implant species and prior fin exposure to prior dopant implantation. Upon later annealing, the amorphized fin region 22B will become polycrystalline (for example, poly-Si(Ge)). A rapid thermal anneal (RTA) in the range of 800-1000° C. may be employed, the heating time being several seconds or less so that the exposed fin region does not have much time to recrystallize from the intact lattice underlying the source/drain regions 32 and therefore forms a polycrystalline structure having sufficient resistivity to function as a fuse. The polycrystalline fin channel region obtained following annealing is schematically shown in FIGS. 9A and 9B, and forms the fuse region 22C within the exemplary structure. The fuse region 22C, which comprises the polycrystalline fin channel region, and the source/drain regions 32 have the same conductivity types and optionally the same doping concentrations.

A dielectric material such as silicon dioxide is deposited on the structure shown in FIG. 8 and planarized. Chemical mechanical planarization (CMP) is employed following deposition of a conformal dielectric layer in some embodiments to planarize the structure down to the tops of the spacers 31. A dielectric layer 38 accordingly fills the recess 36 and encapsulates the fin region that comprises the fuse. The "gate structures" provided on the fuse regions 22C are accordingly non-functional. As discussed above, annealing the structure causes the formation of the polycrystalline fin channel region having the electrical resistivity considered appropriate for functioning as a fuse region 22C for the particular electronic device formed on the substrate 27.

Figure 10:
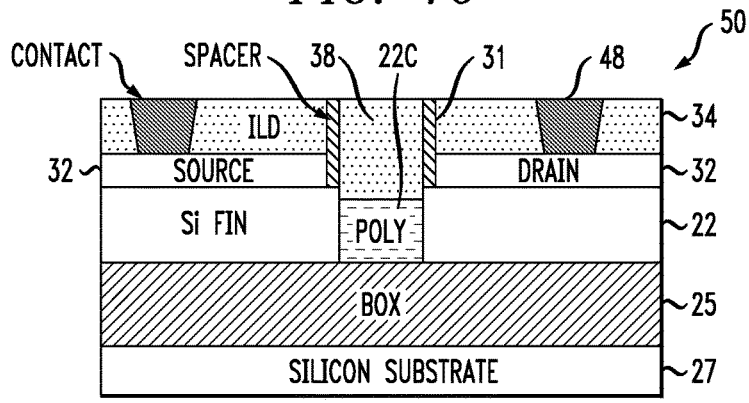
FIG. 10 is a schematic, cross-sectional view showing the structure of FIG. 9 following contact formation.

FIG. 10 shows a completed structure 50 including contacts 48 electrically communicating with the source/drain regions. A replacement gate process is employed with respect to regions of the structure wherein dummy gates are removed to expose fin channel regions that are used to form FinFETs rather than to form fuses. Electrically conductive contacts 48 are then formed to obtain the structure 50 shown schematically in FIG. 10. Contacts may be formed at the same time for the functional FinFET devices (not shown) that are also formed on the structure as well as the fuse regions. Self-aligned contacts facilitate alignment during fabrication of integrated circuit devices having small dimensions. Such contacts have been formed by depositing metals such as aluminum and tungsten in trenches formed in dielectric materials while avoiding electrical contact with metal gate material of the FinFETs. Self-aligned contacts can accordingly be formed within a metal gate process while preventing gate to contact shorts. A dielectric layer (not shown) can be formed to protect the gate electrodes during contact formation. The source/drain structures 32 shown in FIG. 10 function as two terminals of the fuse (polycrystalline fuse region 22C) while the contacts 48 electrically coupled to the source/drain structures allow electrical power to be applied to destroy the fuse region if necessary.

FIGS. 1-10, as discussed above, depict exemplary processing steps/stages in the fabrication of an exemplary structure 50 including one or more semiconductor fuses. Although the overall fabrication method and the structures formed thereby are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, one or more of the processing steps and tooling used to fabricate semiconductor devices are also described in a number of readily available publications, including, for example James D. Plummer et al., *Silicon VLSI Technology: Fundamentals, Practice, and Modeling* $1^{st}$ *Edition*, Prentice Hall, 2001, which is hereby incorporated by reference herein. It is emphasized that while some individual processing steps are set forth herein, those steps are merely illustrative, and one skilled in the art may be familiar with several equally suitable alternatives that would be applicable.

It is to be appreciated that the various layers and/or regions shown in the accompanying figures may not be drawn to scale. Furthermore, one or more semiconductor layers of a type commonly used in such integrated circuit devices or other layers may not be explicitly shown in a given figure for ease of explanation. This does not imply that the semiconductor layer(s) or other layer(s) not explicitly shown are omitted in the actual integrated circuit device.

Given the discussion thus far, it will be appreciated that, in general terms, an exemplary fabrication method includes obtaining a monolithic structure including a semiconductor fin 22, a dummy gate 30 on the semiconductor fin, spacers 31 on the dummy gate, and first and second source/drain regions 32 on opposing sides of the dummy gate. The dummy gate 30 is removed to expose a portion of the fin beneath the dummy gate and the exposed portion of the fin is doped to obtain a doped fin channel region 22A, such as shown in FIG. 7. This doping step has the effect of providing electrical conductivity to the channel region. The method further includes amorphisizing the exposed portion of the fin. The doped fin channel region may be subjected to ion implantation using a non-electrically-active dopant such as germanium to amorphize the doped channel region of the fin. The amorphized region 22B is schematically illustrated in FIG. 8. The amorphized, doped fin channel region is annealed to form a substantially polycrystalline fuse region 22C operatively associated with the source/drain regions 32, which are functional as terminals for the fuse region 22C. In some embodiments, the fin 22 comprises silicon and subjecting the doped fin channel region to ion implantation includes implanting germanium, argon or silicon ions within the doped fin channel region. The method may further include partially recessing the portion of the fin beneath the dummy gate so that the fin height and width in the channel region are less than the fin height and width outside the channel region. FIG. 6 shows an exemplary structure including a fin channel region having reduced height and width dimensions, which facilitates fuse design. The desired fuse resistivity and breakdown characteristics define the fin size within the channel region. The fuse region consists essentially of doped polycrystalline silicon in some embodiments. Expanded source/drain regions 32 having the same conductivity type as the fuse region are grown in some embodiments.

Given the discussion thus far, it will also be appreciated that an exemplary monolithic structure is provided that includes a substrate 24 including a plurality of parallel, monocrystalline semiconductor fins 22, the fins including one or more channel regions and outer fin portions integral with and adjoining the channel regions. While a SOI substrate is shown for illustrative purposes, the substrate is a bulk semiconductor substrate in some embodiments. Source/drain regions 32 are on the outer fin portions of one or more of the fins, each of the channel regions being adjoined by a pair of the source/drain regions. A gate structure adjoins each channel region. The gate structures are functional when fabricated for incorporation in FinFETs on the substrate and non-functional when associated with fin channel regions used as fuses. The channel region of at least one of the parallel semiconductor fins 22 includes a substantially polycrystalline, doped fuse region 22C operatively associated with a pair of the source/drain regions 32, which are functional as terminals for the doped fuse region 22C. The portion(s) of the fins forming the fuse region(s) have smaller height and width dimensions than those of the outer fin portions in some embodiments. The fuse region 22C consists essentially of doped polycrystalline silicon having a selected conductivity type in some embodiments.

At least a portion of the techniques described above may be implemented in an integrated circuit. In forming integrated circuits, identical dies are typically fabricated in a repeated pattern on a surface of a semiconductor wafer. Each die includes a device described herein, and may include other structures and/or circuits. The individual dies are cut or diced from the wafer, then packaged as an integrated circuit. One skilled in the art would know how to dice wafers and package die to produce integrated circuits.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having FinFET devices and associated fuses formed in accordance with one or more of the exemplary embodiments.

The illustrations of embodiments described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. It should also be noted that, in some alternative implementations, some of the steps of the exemplary methods may occur out of the order noted in the figures. For example, two steps shown in succession may, in fact, be executed substantially concurrently, or certain steps may sometimes be executed in the reverse order, depending upon the functionality involved. The drawings are also merely representational and are not drawn to scale. Accordingly, the specification and drawings are to be regarded in an illustrative rather than a restrictive sense.

Embodiments are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of any means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit thereof. The embodiments were chosen and described in order to best explain principles and practical applications, and to enable others of ordinary skill in the art to understand the various embodiments with various modifications as are suited to the particular use contemplated.

The abstract is provided to comply with 37 C.F.R. §1.72 (b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, the claimed subject matter may lie in less than all features of a single embodiment. Thus the following claims are hereby incorporated into the Detailed Description, with each claim standing on its own as separately claimed subject matter.

Given the teachings provided herein, one of ordinary skill in the art will be able to contemplate other implementations and applications of the techniques and disclosed embodiments. Although illustrative embodiments have been described herein with reference to the accompanying drawings, it is to be understood that illustrative embodiments are not limited to those precise embodiments, and that various other changes and modifications are made therein by one skilled in the art without departing from the scope of the appended claims.

What is claimed is:

1. A fabrication method comprising:
    obtaining a monolithic structure including a semiconductor fin, a dummy gate on the semiconductor fin, spacers on the dummy gate, and first and second source/drain regions on opposing sides of the dummy gate;
    removing the dummy gate to expose a portion of the fin beneath the dummy gate;
    doping the exposed portion of the fin with an n-type or a p-type dopant;
    amorphisizing the exposed portion of the fin, and
    annealing the amorphized, exposed portion of the fin to obtain a doped, substantially polycrystalline fuse region operatively associated with the source/drain regions.

2. The method of claim 1, wherein the monolithic structure further includes a plurality of parallel semiconductor fins and a plurality of dummy gates formed on the plurality of parallel semiconductor fins, further including forming a plurality of FinFET devices using one or more of the plurality of parallel semiconductor fins.

3. The method of claim 1, wherein the fin comprises silicon and amorphisizing the exposed portion of the fin includes subjecting the exposed portion of the fin to ion implantation.

4. The method of claim 1, further including encapsulating the substantially polycrystalline fuse region with a dielectric layer.

5. The method of claim 4, wherein the monolithic structure further includes a dielectric layer on the source/drain regions.

6. The method claim 5, further including reducing one or more dimensions of the exposed portion of the fin.

7. The method of claim 6, wherein the one or more dimensions includes fin width.

8. The method of claim 1, wherein the fin consists essentially of monocrystalline silicon.

9. The method of claim 8, further including reducing one or more dimensions of the exposed portion of the fin.

10. The method of claim 8, wherein the fuse region consists essentially of doped polycrystalline silicon, the fuse region and the source/drain regions having the same polarity.

11. The method of claim 10, wherein the monolithic structure further includes a plurality of parallel semiconductor fins and a plurality of dummy gates formed on the plurality of parallel semiconductor fins, further including forming a plurality of FinFET devices using one or more of the plurality of parallel semiconductor fins.

* * * * *